(12) United States Patent
Uno et al.

(10) Patent No.: US 12,358,028 B2
(45) Date of Patent: Jul. 15, 2025

(54) CLEANING APPARATUS FOR CLEANING MEMBER, CLEANING METHOD FOR CLEANING MEMBER, AND SUBSTRATE CLEANING METHOD

(71) Applicant: EBARA CORPORATION, Tokyo (JP)

(72) Inventors: Megumi Uno, Tokyo (JP); Akira Fukunaga, Tokyo (JP); Chikako Takatoh, Tokyo (JP); Yumiko Nakamura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 18/266,774

(22) PCT Filed: Dec. 14, 2021

(86) PCT No.: PCT/JP2021/045915
§ 371 (c)(1),
(2) Date: Jun. 12, 2023

(87) PCT Pub. No.: WO2022/131228
PCT Pub. Date: Jun. 23, 2022

(65) Prior Publication Data
US 2024/0050991 A1 Feb. 15, 2024

(30) Foreign Application Priority Data
Dec. 16, 2020 (JP) ................................. 2020-208638

(51) Int. Cl.
*H01L 21/67* (2006.01)
*B08B 1/12* (2024.01)
(Continued)

(52) U.S. Cl.
CPC ................. *B08B 1/50* (2024.01); *B08B 1/12* (2024.01); *B08B 1/20* (2024.01); *B08B 1/32* (2024.01);
(Continued)

(58) Field of Classification Search
CPC ........................ H01L 21/00–86; B24B 53/017
See application file for complete search history.

(56) References Cited

U.S. PATENT DOCUMENTS

2008/0289652 A1  11/2008  Hamada
2014/0261537 A1*  9/2014  Chang ..................... B08B 1/54
                                                      134/201

(Continued)

FOREIGN PATENT DOCUMENTS

CN  111029243 A   4/2020
JP  H05-326474 A  12/1993
(Continued)

OTHER PUBLICATIONS

International Patent Application No. PCT/JP2021/045915; Int'l Search Report; dated Feb. 15, 2022; 4 pages.

*Primary Examiner* — Eric W Golightly
*Assistant Examiner* — Richard Z. Zhang
(74) *Attorney, Agent, or Firm* — BakerHostetler

(57) ABSTRACT

A cleaning apparatus for cleaning member has a member cleaning part 30 that cleans a cleaning member 10 that cleans a substrate W; and a measurement part 20 that measures a degree of cleanliness of the cleaning member 10 cleaned by the member cleaning part 30.

5 Claims, 18 Drawing Sheets

(51) Int. Cl.
*B08B 1/20* (2024.01)
*B08B 1/32* (2024.01)
*B08B 1/50* (2024.01)
*B08B 3/04* (2006.01)
*B08B 13/00* (2006.01)

(52) U.S. Cl.
CPC .............. *B08B 3/041* (2013.01); *B08B 13/00* (2013.01); *H01L 21/67046* (2013.01)

(56) References Cited

U.S. PATENT DOCUMENTS

| | | |
|---|---|---|
| 2015/0221531 A1 | 8/2015 | Tanaka |
| 2020/0116480 A1 | 4/2020 | Shima |
| 2021/0039142 A1 | 2/2021 | Takatoh et al. |
| 2021/0175099 A1 * | 6/2021 | Isokawa .................... B08B 1/32 |

FOREIGN PATENT DOCUMENTS

| | | | | |
|---|---|---|---|---|
| JP | 2003-243350 A | 8/2003 | | |
| JP | 2010-074191 A | 4/2010 | | |
| JP | 2020-061469 A | 4/2020 | | |
| JP | 2020-136488 A | 8/2020 | | |
| TW | 201706045 A | 2/2017 | | |
| WO | WO-2018207704 A1 * | 11/2018 | ............. | B08B 1/006 |
| WO | WO 2019/176455 A1 | 9/2019 | | |

\* cited by examiner

CLEANING APPARATUS FOR CLEANING MEMBER, CLEANING METHOD FOR CLEANING MEMBER, AND SUBSTRATE CLEANING METHOD

CROSS-REFERENCE TO RELATED APPLICATIONS

This application is a U.S. national phase application of International Patent Application No. PCT/JP2021/045915 filed Dec. 14, 2021, which claims priority to Japanese Patent Application No. 2020-208638 filed Dec. 16, 2020, which are incorporated by reference in their entireties for any and all purposes.

TECHNICAL FIELD

The present invention relates to a cleaning apparatus for cleaning a cleaning member, a cleaning method for a cleaning member, and a substrate cleaning method using the cleaning apparatus for a cleaning member.

BACKGROUND ART

Hitherto, a substrate cleaning apparatus for cleaning a substrate such as a wafer has been known. A cleaning member such as a roll cleaning member or a pencil cleaning member is used when performing scrubbing or the like to clean the substrate. Cleaning of such a cleaning member has been performed according to the related art. For example, JP 2020-136488 A discloses an aspect in which a cleaning apparatus for a cleaning member includes a removal unit that removes contaminants adhering to a columnar cleaning member rotating around an axial center in a state of scrubbing a substrate while cleaning liquid is supplied, and the removal unit has squeezing means that applies a pressure to the cleaning member to squeeze the contaminants and suction/discharging means that sucks and discharges the cleaning liquid containing the contaminants squeezed by the squeezing means.

SUMMARY OF INVENTION

Problem to be Solved by Invention

Although it has been conventionally proposed to perform cleaning of a cleaning member as described in JP 2020-136488 A, confirmation of whether or not the cleaning member has actually been cleaned is not performed. For example, it is treated that the cleaning member is cleaned when the cleaning member has been pressed and cleaned for a predetermined time or more according to an empirical rule or the like.

The present invention provides a cleaning apparatus for a cleaning member and the like capable of confirming whether or not the cleaning member has been cleaned.

Means for Solving Problem

A cleaning apparatus for a cleaning member according to the present invention may comprise:
  a member cleaning part that cleans a cleaning member that cleans a substrate; and
  a measurement part that measures a degree of cleanliness of the cleaning member cleaned by the member cleaning part.

In the cleaning apparatus for cleaning member according to the present invention, the measurement part may measure the degree of cleanliness of the cleaning member by measuring an adhesion force of the cleaning member.

In the cleaning apparatus for cleaning member according to the present invention, the measurement part may measure the adhesion force of the cleaning member by an AFM method or a measuring method using an indenter.

In the cleaning apparatus for cleaning member according to the present invention, the measurement part may measure the adhesion force of the cleaning member by pressing the cleaning member against a first member and then measuring a peeling force when the cleaning member is peeled off.

The cleaning apparatus for cleaning member according to the present invention may further comprise a control part that controls the member cleaning part to perform re-cleaning of the cleaning member when the adhesion force of the cleaning member measured by the measurement part is equal to or less than a threshold.

In the cleaning apparatus for cleaning member according to the present invention, the measurement part may measure the adhesion force of the cleaning member after the re-cleaning is completed, and wherein the control part controls to prompt replacement of the cleaning member when the adhesion force measured by the measurement part after n times of the re-cleaning is completed is equal to or less than the threshold.

In the cleaning apparatus for cleaning member according to the present invention, the member cleaning part may have a drive part that rotates the cleaning member, and the measurement part may measure the degree of cleanliness of the cleaning member by measuring a rotational torque of the drive part in a state where the cleaning member is pressed against a second member.

The cleaning apparatus for cleaning member according to the present invention may further comprise, a control part that controls the member cleaning part to perform re-cleaning of the cleaning member when the rotational torque of the drive part measured by the measurement part is equal to or less than a threshold.

In the cleaning apparatus for cleaning member according to the present invention, after the re-cleaning is completed, the measurement part may measure the rotational torque of the drive part in a state where the cleaning member is pressed against the second member and the control part may control to prompt replacement of the cleaning member when the rotational torque measured by the measurement part after n times of the re-cleaning is completed is equal to or less than a threshold.

A cleaning method for cleaning member according to the present invention may comprise steps of:
  cleaning a substrate by a cleaning member;
  cleaning the cleaning member by a member cleaning part after the substrate is cleaned; and
  measuring, by a measurement part, a degree of a cleanliness of the cleaning member after the cleaning member is cleaned by the member cleaning part.

The cleaning method for cleaning member according to the present invention may further comprise steps of:
  performing re-cleaning of the cleaning member by the member cleaning part when an adhesion force of the cleaning member or a rotational torque of a drive part of the member cleaning part in a state where the cleaning member is pressed against a second member, measured by a measurement part, is equal to or less than a threshold;

measuring, by the measurement part, the adhesion force of the cleaning member or the rotational torque of the drive part of the member cleaning part in a state where the cleaning member is pressed against the second member after the re-cleaning is completed; and prompting, by a notification part, replacement of the cleaning member in a case where the adhesion force or the rotational torque measured by the measurement part after n times of the re-cleaning are performed is equal to or less than a threshold.

A substrate cleaning apparatus may comprise:

a rotation holding mechanism that holds and rotates a substrate;

a substrate cleaning part that has a cleaning member and cleans the substrate by the cleaning member;

a member cleaning part that cleans the cleaning member;

a measurement part that measures a degree of cleanliness of the cleaning member cleaned by the member cleaning part; and a control part that controls the member cleaning part to clean the cleaning member and the measurement part to measure the degree of cleanliness of the cleaning member after one or a predetermined number of substrates are cleaned.

A substrate cleaning method may comprise:

holding and rotating a substrate by a rotation holding mechanism;

cleaning, by a substrate cleaning part including a cleaning member, the substrate using the cleaning member;

cleaning the cleaning member by a member cleaning part; and measuring, by a measurement part, a degree of cleanliness of the cleaning member cleaned by the member cleaning part, wherein after one or a predetermined number of substrates are cleaned, the cleaning member may be cleaned by the member cleaning part, and the degree of cleanliness of the cleaning member may be measured by the measurement part.

Effect of Present Invention

In the present invention, in a case of adopting the measurement part that measures the degree of cleanliness of a cleaning member cleaned in the member cleaning part, it is possible to confirm whether or not cleaning of the cleaning member has been performed and a predetermined cleaning ability has been restored. Further, it is also possible to detect the lifetime of the cleaning member.

EMBODIMENT OF THE INVENTION

Embodiment

<<Configuration>>

An embodiment of a substrate processing apparatus including a substrate cleaning apparatus and the like will be described. In the present embodiment, "or" is a concept including "and", and "A or B" includes any aspect of "A, B, and both A and B".

Figure 1:
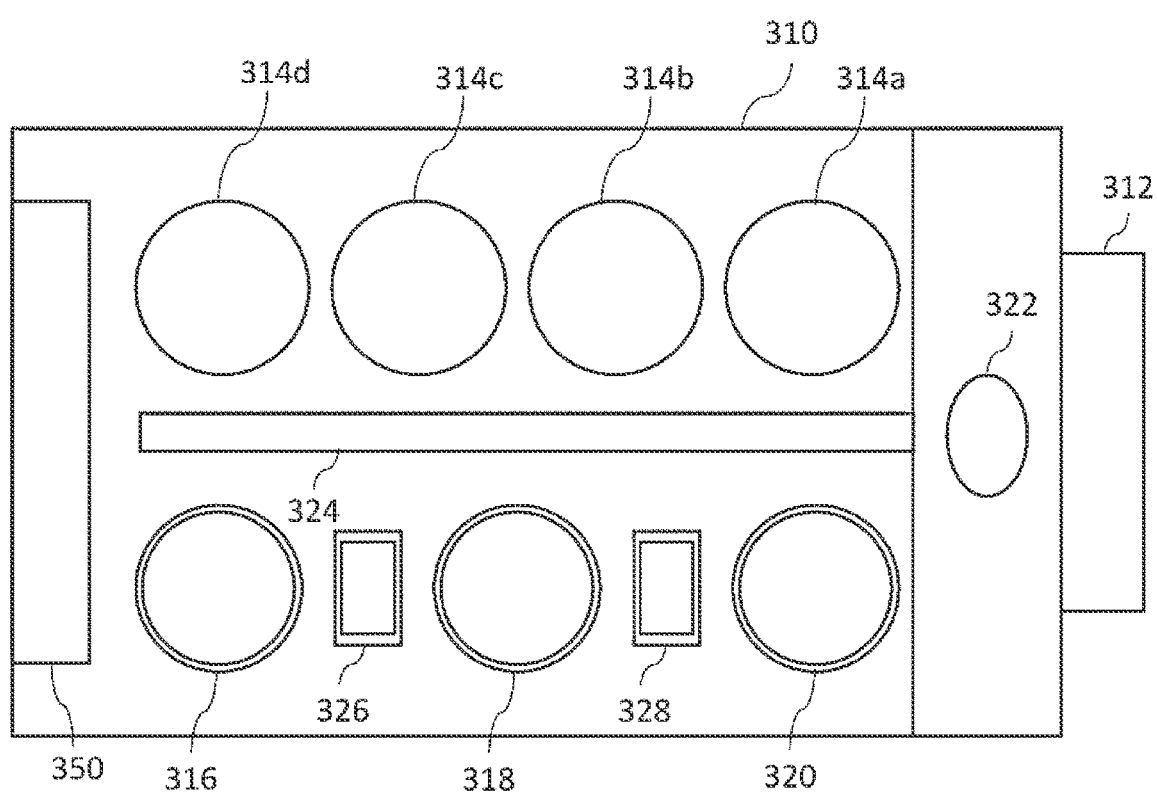
FIG. 1 is a schematic view showing an example of a substrate processing apparatus that can be used in an embodiment of the present invention.

As shown in FIG. 1, the substrate processing apparatus, according to the present embodiment, has a roughly rectangular housing 310 and a load port 312; a substrate cassette that stocks a number of substrates W is put on the load port 312. The load port 312 is placed adjacent to the housing 310. The load port 312 can be loaded with an open cassette, a SMIF (Standard Mechanical Interface) pod or a FOUP (Front Opening Unified Pod). A SMIF pod and a FOUP are hermetically sealed enclosure that stores therein a substrate cassette and covers it with a bulkhead, and whereby an environment independent of the external space can be maintained. The substrate W is, for example, a semiconductor wafer and the like.

Inside the housing 310, a plurality of (in an aspect shown in FIG. 1, four) polishing units 314*a* to 314*d*, first and second cleaning units 316 and 318 for cleaning a polished substrate W, and a drying unit 320 for drying the cleaned substrate W is contained. The polishing units 314a to 314d are arranged along a long side of the substrate processing apparatus, and the cleaning units 316 and 318 and the drying unit 320 are also arranged along the long side of the substrate processing apparatus. The substrate processing apparatus according to the present embodiment can polish various substrates W in a step of manufacturing a semiconductor wafer with a diameter of 300 mm or 450 mm, a flat panel, an image sensor such as complementary metal oxide semiconductor (CMOS) or charge coupled device (CCD), and a magnetic film in a magnetoresistive random access memory (MRAM). The substrate processing apparatus according to another embodiment may be configured to clean and dry a substrate W without a polishing unit for polishing the substrate W inside the housing 310.

In an area surrounded by the load port 312, and the polishing unit 314a and the drying unit 320 that are located on the side of the load port 312, a first transfer robot 322 is placed. Furthermore, a conveyance unit 324 is placed parallel to the polishing units 314a to 314d as well as the cleaning units 316 and 318 and the drying unit 320. The first transfer robot 322 receives a pre-polished substrate W from the load port 312 and transfers the substrate W to the conveyance unit 324, or takes out a dried substrate W from the drying unit 320 and returned to the load port 312.

A second transfer robot 326 for transferring a substrate W between the first cleaning unit 316 and the second cleaning unit 318 is placed between the first cleaning unit 316 and the second cleaning unit 318, and a third conveyance unit 328 for transferring the substrate W between the second cleaning unit 318 and the drying unit 320 is placed between the second cleaning unit 318 and the drying unit 320. Furthermore, inside the housing 310, an overall control part 350 for controlling the operation of each device of the substrate processing apparatus is placed. In the present embodiment, there is described the aspect in which the overall control part 350 is placed inside the housing 310; however, the placement of the overall control part 350 is not limited to this, and the overall control part 350 may be placed outside the housing 310, and the overall control part 350 may be provided at a remote place.

A roll cleaning apparatus for scrubbing a surface of a substrate W while rotating around the center axis parallel with the substrate W by bringing the roll cleaning member 100 (see FIG. 2) linearly extending almost along the full diameter of the substrate W into contact with cleaning liquid may be used for the first cleaning unit 316. A pencil cleaning apparatus for scrubbing a surface of a substrate W by bringing the contact faces of the vertically-extending columnar pencil cleaning members 150 (see FIG. 3) into contact with cleaning liquid and moving the pencil cleaning members 150 in one direction while rotating may be used for the second cleaning unit 318. A spin drying unit for drying a substrate W by injecting IPA steam from a moving injection nozzle toward the horizontally-held and rotating substrate W and drying the substrate W by centrifugal force by faster rotating the substrate W may be used for the drying unit 320.

The first cleaning unit 316 may use not a roll cleaning apparatus, but a pencil cleaning apparatus similar to the second cleaning unit 318 or a two-fluid jet cleaning apparatus for cleaning a surface of a substrate W by two-fluid jet. Further, the second cleaning unit 318 may use not a pencil cleaning apparatus, but a roll cleaning apparatus similar to the first cleaning unit 316, or a two-fluid jet cleaning apparatus for cleaning a surface of a substrate W by two-fluid jet.

The cleaning liquid in the present embodiment contains rinse liquid, such as deionized water (DIW), and chemical liquid, such as ammonia hydrogen peroxide solution (SC1), hydrochloric acid hydrogen peroxide solution (SC2), sulfuric acid hydrogen peroxide solution (SPM), or hydrofluoric acid. In the present embodiment, unless otherwise specified, cleaning liquid means either rinse liquid, chemical liquid or the both rinse liquid and chemical liquid.

Figure 2:
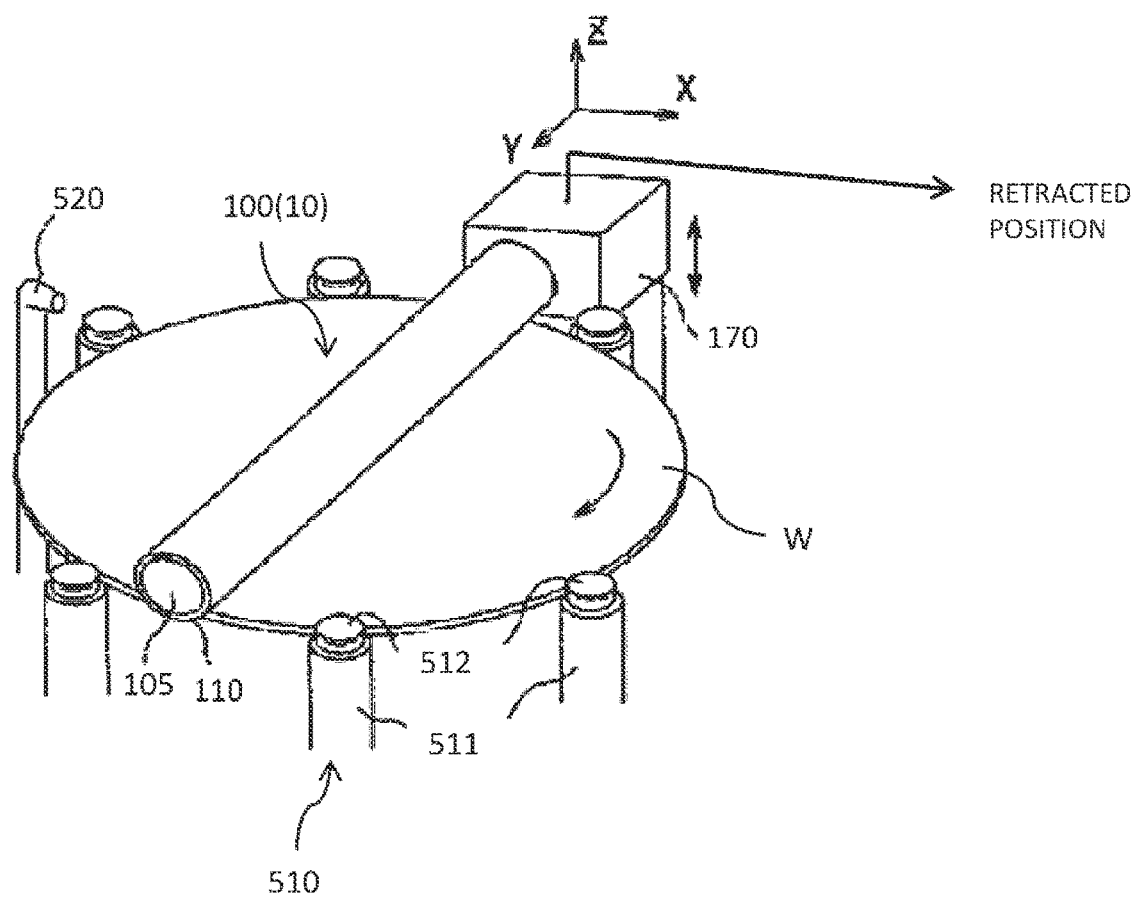
FIG. 2 is a perspective view showing an example of a substrate cleaning apparatus using a roll cleaning member.
Figure 3:
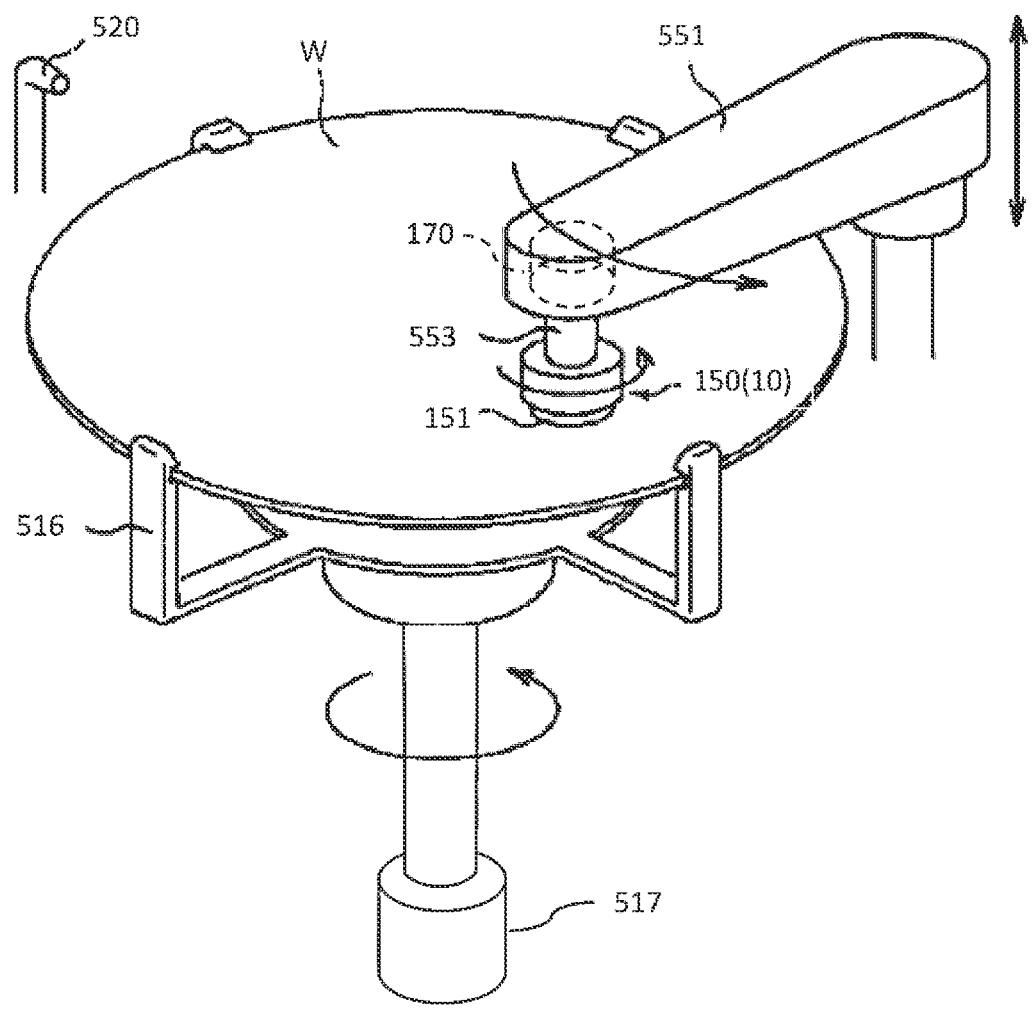
FIG. 3 is a perspective view showing an example of a substrate cleaning apparatus using a pencil cleaning member.

As shown in FIGS. 2 and 3, the substrate cleaning apparatus has a rotation holding mechanism that holds and rotates the substrate W, a drive part 170 that rotates a cleaning member 10, and a substrate cleaning liquid supply part 520 that supplies cleaning liquid to the substrate W. In the aspect shown in FIG. 2, a rotation holding part 510 functions as both a rotation part and a holding part, and also in this case, both the rotation part and the holding are provided in the substrate cleaning apparatus. On the other hand, in the aspect shown in FIG. 3, the substrate W is held by a holding part 516, and the substrate W is rotated by a rotation part 517 rotating the holding part 516.

In the aspect shown in FIG. 2, the rotation holding part 510 as the rotation holding mechanism has a spindle 511 and a piece 512 provided at a distal end of the spindle 511. In the aspect shown in FIG. 3, a rotation shaft 553 for rotating a pencil cleaning member 150 is provided on a distal end side of a swinging arm 551, and the drive part 170 for rotating the rotation shaft is provided.

Figure 10:
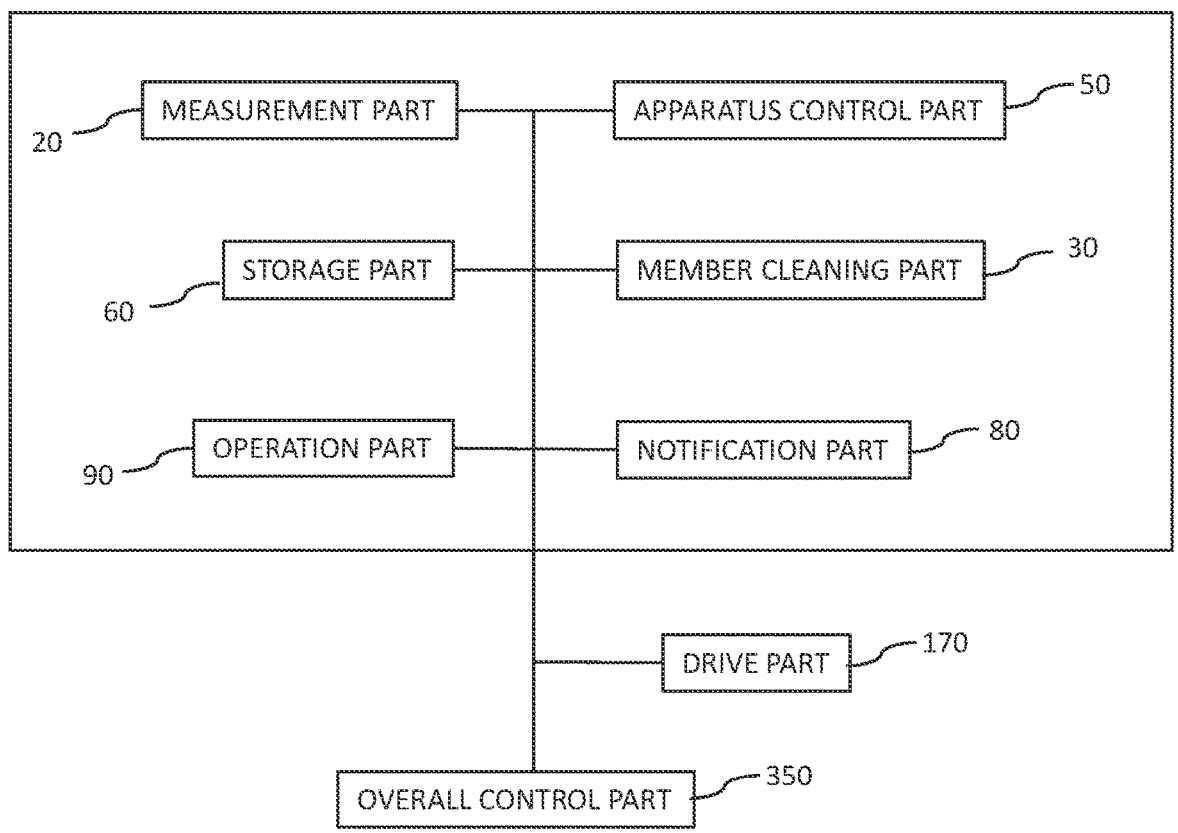
FIG. 10 is a block diagram showing a configuration of the substrate cleaning apparatus that can be used in the present embodiment.

As shown in FIG. 10, the cleaning apparatus for a cleaning member according to the present embodiment may have a member cleaning part 30 that cleans the cleaning member 10 that cleans the substrate W, and a measurement part 20 that measures the degree of cleanliness of the cleaning member 10 cleaned by the member cleaning part 30. Examples of a cleaning degree measurement method include an aspect of measuring an adhesion force as described below, and an aspect of measuring a rotational torque of the drive part 170 for the member cleaning part 30 in a state where the cleaning member 10 is pressed against a second member. A measurement result of the measurement part 20 may be used for control of the cleaning member 10 by an apparatus control part 50 (see FIG. 10) or may be stored in a storage part 60. As an example, the cleaning member 10 is the roll cleaning member 100 as shown in FIG. 2 or the pencil cleaning member 150 as shown in FIG. 3. Hereinafter, the cleaning member 10 is used as a concept including the roll cleaning member 100 and the pencil cleaning member 150. The cleaning member 10 is typically used for post-cleaning for chemical mechanical polishing (CMP). Note that the member cleaning part 30 in FIG. 10 means, as an example, the member cleaning part 30 shown in FIGS. 4 and 5 described below.

Figure 7A:
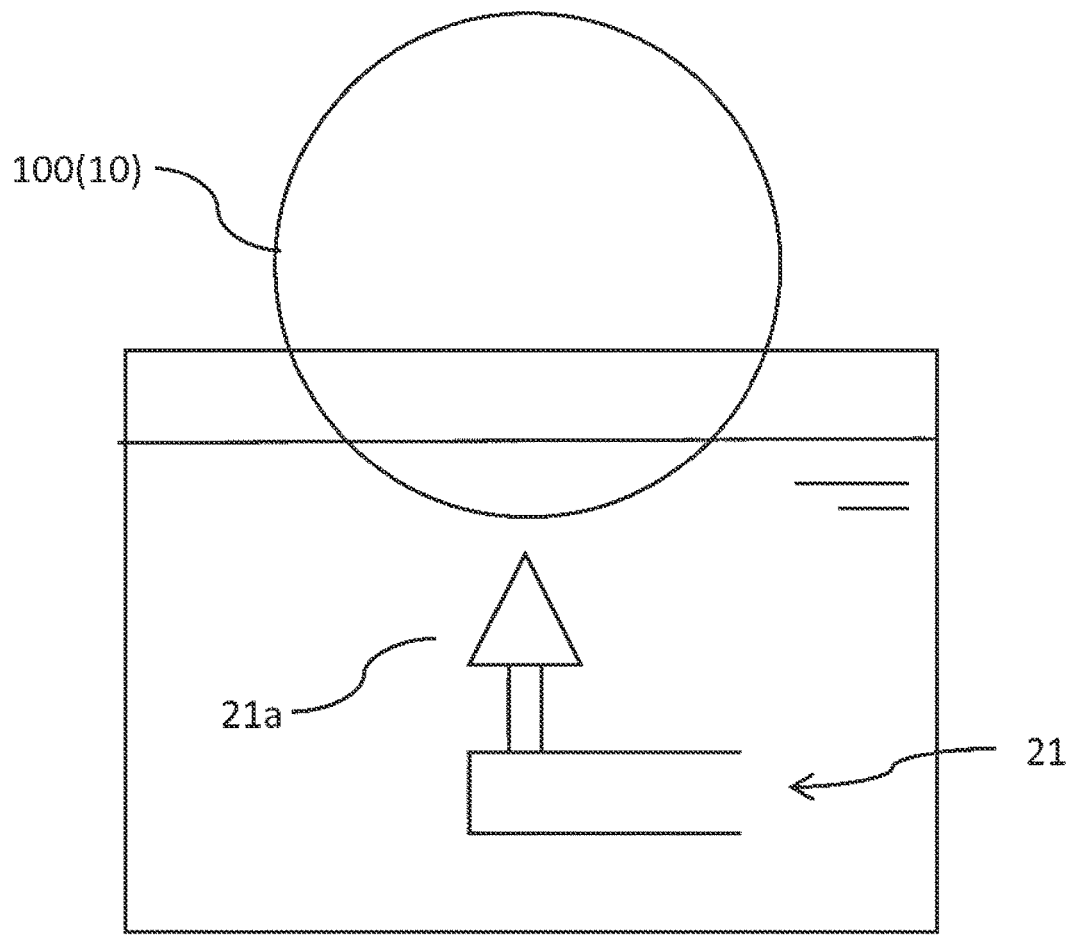
FIG. 7A is a side view showing an aspect in which the degree of adhesion of the roll cleaning member is measured using the AFM.
Figure 7B:
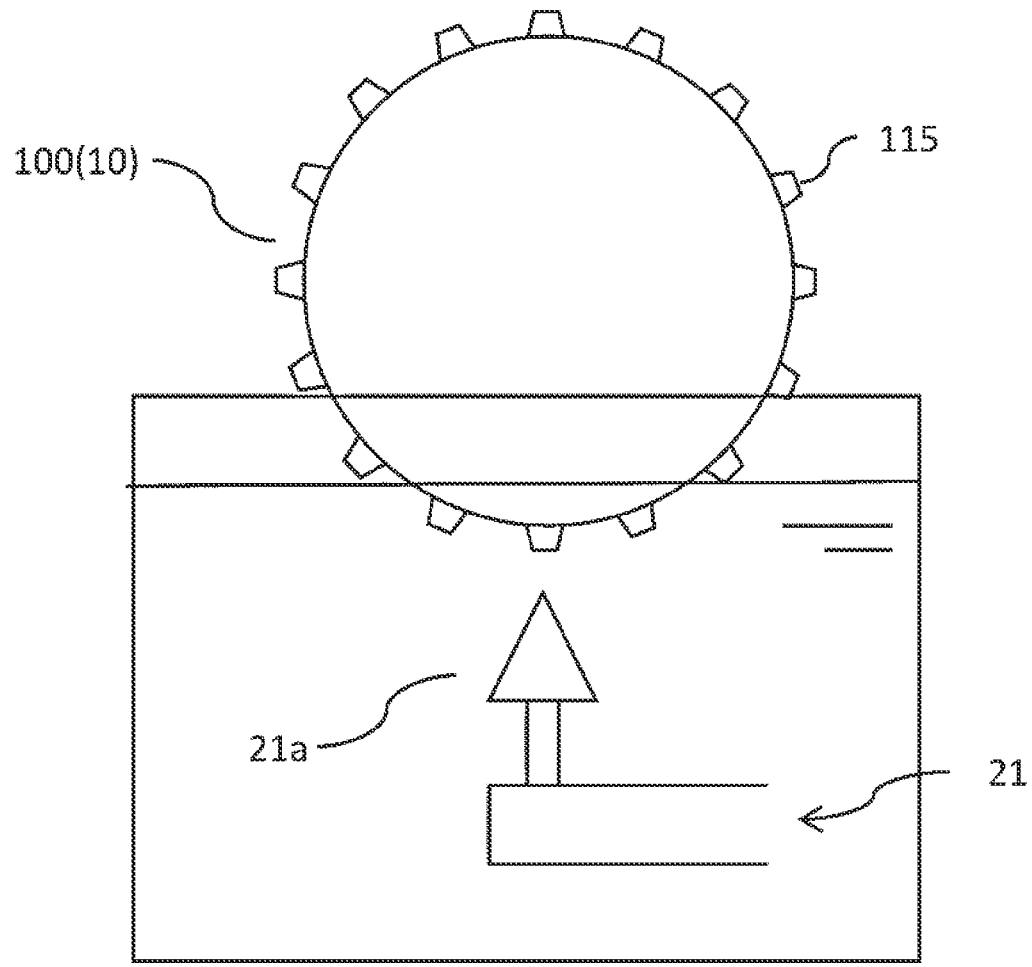
FIG. 7B is a side view showing an aspect in which the degree of adhesion of the roll cleaning member having a nodule is measured using the AFM.

The roll cleaning member 100 shown in FIG. 2 is rotatable around a rotation axis. The roll cleaning member 100 may have a roll main body 110 detachably or fixedly attached to a roll attachment part 105, and a plurality of nodules 115 (see FIG. 7B) may be provided on a surface of the roll main body 110.

The roll cleaning member 100 may be formed of a polyvinyl alcohol (PVA) sponge material or polyvinyl acetal obtained by reacting PVA, for example, polyvinyl formal (PVFM), polyvinyl acetate (PVAc), or the like. The PVA sponge material can be adjusted from a homopolymer of polyvinyl acetate or the like. As a material of the roll cleaning member 100, other moldable materials can be used, such as nylon, polyurethane, a combination of polyurethane and PVA, or other copolymers that do not scratch a substrate surface and provide suitable material removal for processes.

The pencil cleaning member 150 may be formed of a PVA sponge material or a polyvinyl formal (PVFM) obtained by reacting PVA. As a material of the pencil cleaning member 150, nylon, polyurethane, or a combination of polyurethane and PVA may be used.

Figure 4:
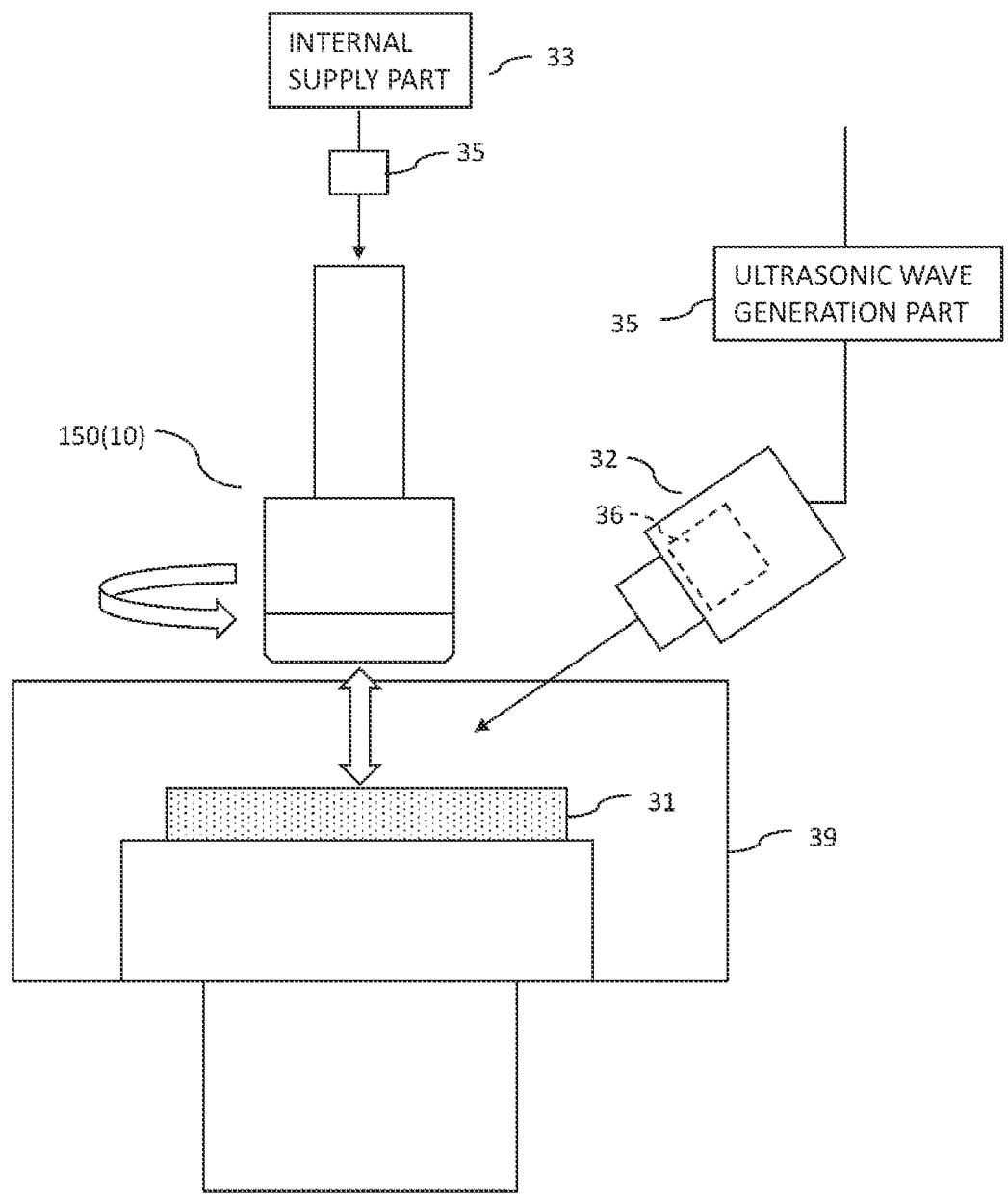
FIG. 4 is a side view showing an example of a cleaning apparatus for a pencil cleaning member.
Figure 5:
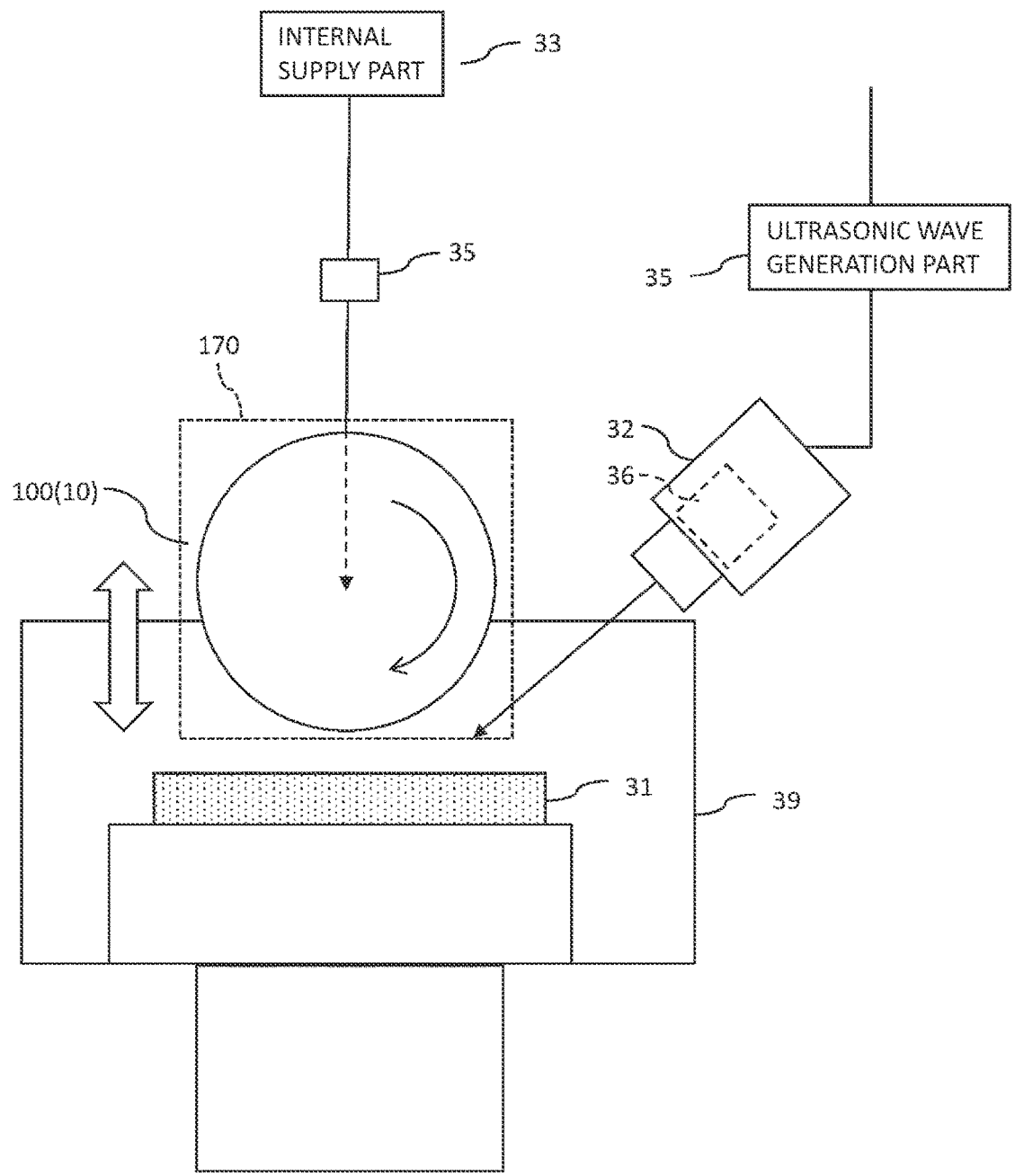
FIG. 5 is a side view showing an example of a cleaning apparatus for a roll cleaning member.

Since contaminants adhering to the substrate W such as a semiconductor substrate and a glass substrate shift to the cleaning member 10 with the cleaning, if cleaning of the substrate W is repeated in this state, scratches or the like occur and the cleaning performance is obviously deteriorated. Therefore, the cleaning member 10 may be cleaned periodically (for example, every time cleaning of one lot of substrates W is completed). At this time, as shown in FIGS. 4 and 5, ultrapure water, alkali-based chemical liquid, or the like may be sprayed from an external supply part 32 outside the cleaning member 10 onto the cleaning member 10 or a quartz cleaning plate 31 while pressing and rotating the cleaning member 10 against the cleaning plate 31 such as a quartz plate for cleaning. Further, the cleaning liquid may be supplied under pressure from an internal supply part 33 toward the outside of the cleaning member 10 through a cleaning liquid supply port provided inside the cleaning member 10. In addition, a suction part (not shown) that sucks ultrapure water or an alkaline-based chemical liquid supplied from the outside of the cleaning member 10 into the cleaning member 10 may be provided. As a result, by repeating suction and extrusion of the chemical liquid with respect to the cleaning member 10, contaminants held by the cleaning member 10 may be discharged to the outside of the brush, and thereafter, the cleaning member 10 may be rinsed with ultrapure water in such a way as not to cause contamination between cleaning chemical liquid for the cleaning member 10 and cleaning chemical liquid for the substrate W. The cleaning plate 31, the external supply part 32, and the internal supply part 33 are examples of the member cleaning part 30, and any one or more of them may be used as the member cleaning part 30.

Figure 6:
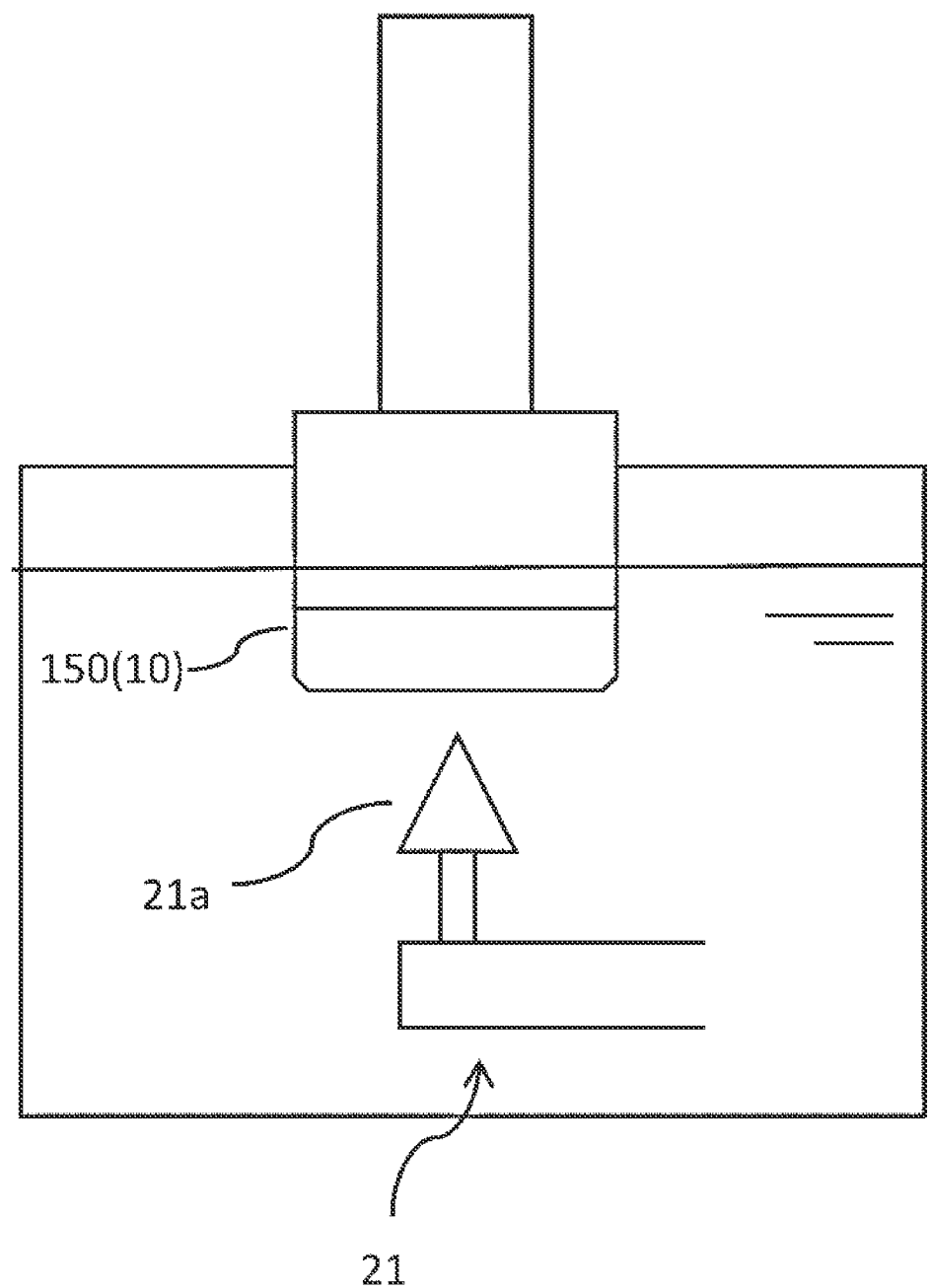
FIG. 6 is a side view showing an aspect in which the degree of adhesion of the pencil cleaning member is measured using an atomic force microscope (AFM).
Figure 7C:
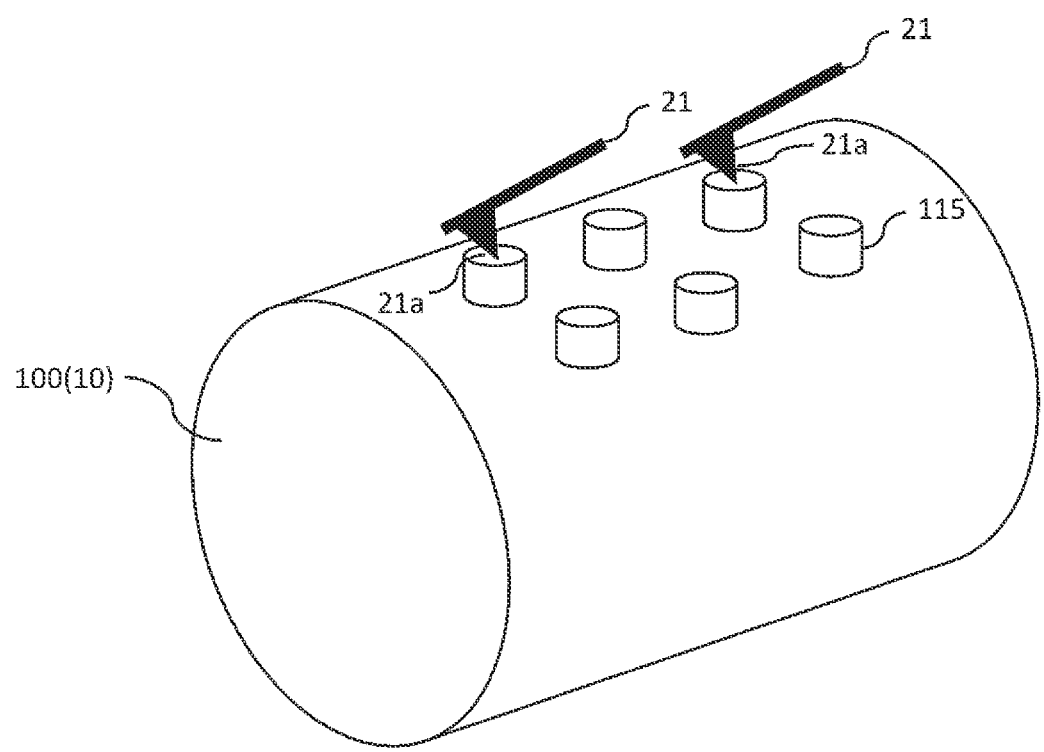
FIG. 7C is a schematic perspective view showing an aspect in which the degree of adhesion of the roll cleaning member having the nodule is measured using the AFM.
Figure 7D:
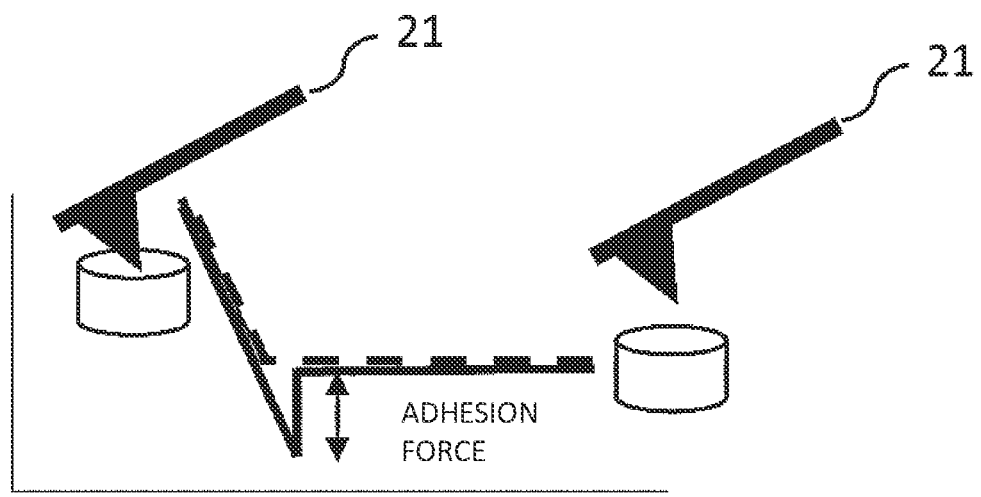
FIG. 7D is a graph showing a difference in adhesion force in a case where the degree of adhesion of the roll cleaning member having the nodule is measured using the AFM.
Figure 15:
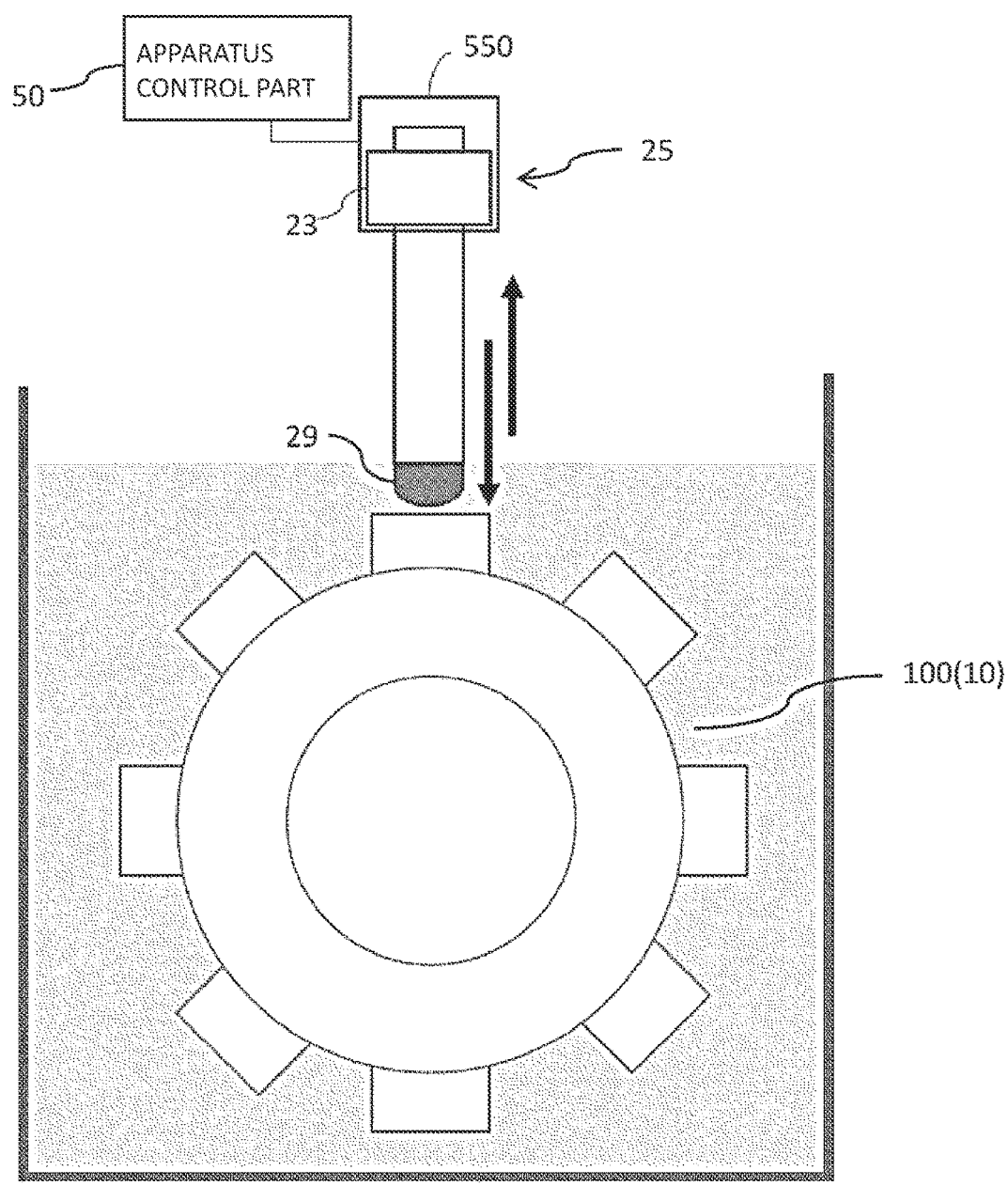
FIG. 15 is a side view of an adhesion force measurement apparatus that measures the degree of adhesion of the roll cleaning member by peeling.

The measurement part 20 may measure an adhesion force of the cleaning member 10 by using an AFM method. The AFM means an atomic force microscope. As shown in FIGS. 6 and 7, in an AFM 21, a sample surface is scanned with a fine probe 21a and a measurement result based on a van der Waals force is used, and thus, not only a nanoscale uneven shape of the cleaning member 10 can be three-dimensionally measured, but also the adhesion force of the cleaning member 10 can be measured. The AFM 21 is an example of the measurement part 20. In a case where the roll cleaning member 100 has the nodules 115, a plurality of probes 21a may be provided and adhesion forces for the plurality of nodules 115 may be simultaneously measured, or the adhesion forces for the nodules 115 may be measured one by one in order by moving the probe 21a. In addition, the probe 21a may measure an adhesion force for a plurality of positions of one nodule 115. In a case where the probe 21a of the AFM 21 is adsorbed to the surface of the cleaning member 10 (the adhesion force exceeds a first threshold), the apparatus control part 50 may determine that the cleaning member 10 has been cleaned. FIG. 7C illustrates an aspect in which the nodules 115 of the roll cleaning member 100 are sequentially measured. In an aspect indicated by a solid line in FIG. 7D, the adhesion force is exhibited, and it can be confirmed that cleaning has been performed. On the other hand, in an aspect illustrated by a broken line in FIG. 7D, the adhesion force is not exhibited, and it can be confirmed that the cleaning has not been performed. A distal end of the probe 21a may be pointed or may be a flat surface or a spherical surface. Note that a measurement method using an indenter 29 having a wider contact area than that in the AFM method or having a spherical shape may be used (see FIG. 15). The shape of the indenter 29 is not particularly limited, and may be a shape as shown in FIG. 15, a quadrangular shape, or an arc shape when viewed from the side. In a case where the indenter 29 is used, the measurement can be performed in a macroscopic region unlike the AFM method. Also in this case, when the indenter is adsorbed to the surface of the cleaning member 10 (the adhesion force exceeds a third threshold), the apparatus control part 50 may determine that the cleaning member 10 has been cleaned. A contact part between the distal end of the probe 21a and a distal end of the indenter 29 may have the same component as contaminants of the brush, and for example, silica, ceria, alumina, or the like as an abrasive grain component, or an oxide or a complex of a wafer or a pattern component (silica, copper, cobalt, tungsten, ruthenium, or the like) as an abrasive waste may be used. As a method of processing the distal end of the probe 21a and the distal end of the indenter 29, distal end coating by sputtering, vapor deposition, plating, or the like, oxidation treatment by heating or the like as surface treatment, complexing treatment by immersion in chemical liquid in advance, or the like may be performed, and a metal having a minute size or a particle appropriately treated may be bonded to the distal end of the probe.

A thermal coating may be provided on the surface of the nodule 115. Then, at the time of standby of the roll cleaning member 100, in a state where rotation of the roll cleaning member 100 is stopped, the probe 21a may be brought close to and into contact with a surface of the thermal coating of the nodule 115 located immediately above at a constant speed, and after holding for a certain time with a constant pressing force, an adhesion force generated when the probe is pulled away from the surface of the thermal coating at a constant speed may be measured (see FIG. 7D).

Figure 8:
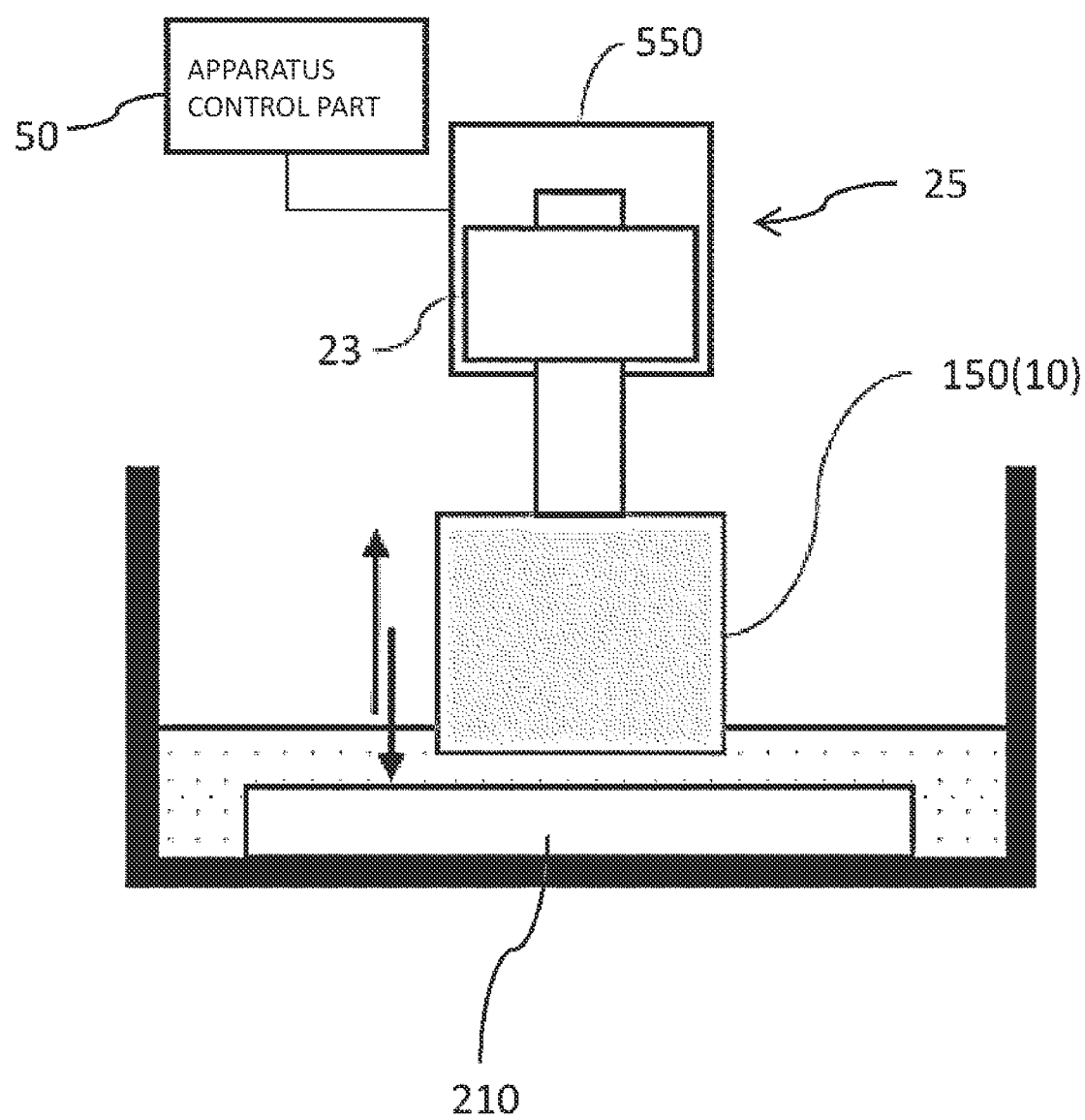
FIG. 8 is a side view of an adhesion force measurement apparatus that measures the degree of adhesion of the pencil cleaning member by peeling.
Figure 9:
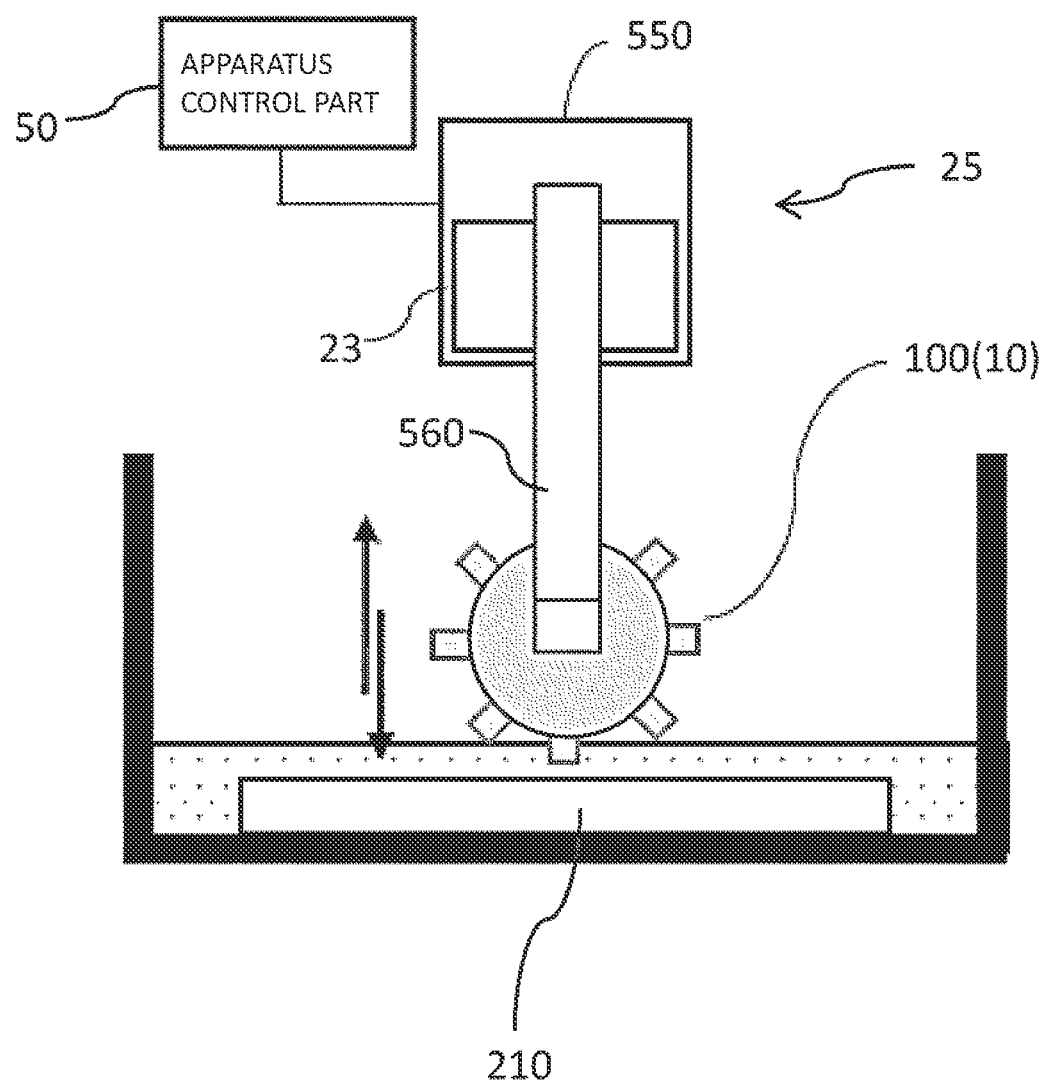
FIG. 9 is a side view of an adhesion force measurement apparatus that measures the degree of adhesion of the roll cleaning member by peeling.

The measurement part 20 may measure the adhesion force of the cleaning member 10 by pressing the cleaning member 10 against a first member 210 such as a test plate and then measuring a peeling force at the time of peeling. In this case, for example, an adhesion force measurement part 25 as shown in FIGS. 8 and 9 may be used as an example of the measurement part 20. In this aspect, the first member 210 such as a test plate is placed in liquid such as water, and after the cleaning member 10 is pressed against the first member 210 for a certain period of time, an adhesion force at the time of separation is measured using a load cell 23 or the like. The load cell 23 may be connected to an amplifier, and data amplified by the amplifier may be stored in the storage part 60 by a recording part. Furthermore, the recording part may be controlled by the apparatus control part 50. Note that, in the aspects shown in FIGS. 8 and 9, a vertical movement part 550 such as an actuator that brings the cleaning member 10 close to the first member 210 and presses the cleaning member 10 and separates the cleaning member 10 from the first member 210 is provided. In the aspect shown in FIG. 9, a roll holding part 560 holding both ends of the roll cleaning members 100 are vertically moved by a vertical movement part 550, so that the roll cleaning member 100 is brought close to and pressed against the first member 210 and is separated from the first member 210.

The AFM 21 as shown in FIGS. 6 and 7 and the adhesion force measurement part 25 as shown in FIGS. 8 and 9 may be provided at a retracted position where the cleaning member 10 is positioned when the substrate W is not cleaned, or may be provided in the member cleaning part 30 such as a self-cleaning mechanism that cleans the cleaning member 10. In a case where the roll cleaning member 100 has the nodules 115, a plurality of first members 210 corresponding to the plurality of nodules 115 may be provided, and a force at the time of peeling from the first member 210 may be measured, or a force at the time of peeling one selected nodule 115 from the first member 210 may be measured.

A cleaning tank 39 (see FIGS. 4 and 5) may be provided at the retracted position and chemical liquid such as ammonia may be supplied to clean the cleaning member 10. Further, the member cleaning part 30 may have an ultrasonic wave generation part 35 and clean the cleaning member 10 using ultrasonic waves. In this case, a rotational torque of the drive part 170 including a motor or the like when the cleaning member 10 rotates while being in contact with the cleaning plate 31 including quartz, poly methyl methacrylate (PMMA), or the like may be monitored. Then, in a case where the rotational torque is equal to or less than a certain value (second threshold), the apparatus control part 50 may determine that the surface of the roll cleaning member 100 is in a state where abrasive grains are easily released by ammonia or the like. In this aspect, the cleaning plate 31 is used as the second member, but the present invention is not limited thereto, and a second member for measuring the rotational torque of the drive part 170 may be provided separately from the cleaning plate 31.

In addition, the adhesion force of the AFM 21 or the adhesion force measurement part 25 for the cleaning member 10 for which it is determined that a cleaning ability is deteriorated and the cleaning member 10 cannot withstand the use and/or the rotational torque of the drive part 170 may be measured and stored in the storage part 60, and the apparatus control part 50 may determine the degree of cleanliness, the lifetime, the replacement time, and the like by comparing the adhesion force of the cleaning member in use and/or the adhesion force of the cleaning member 10 for which it is determined that the cleaning member cannot withstand the use and/or the rotational torque of the drive part 170.

In a case where the apparatus control part 50 determines that cleaning of the cleaning member 10 is necessary based on the measurement result of the measurement part 20, the cleaning member 10 may be cleaned by rotation with the chemical liquid supplied for a certain period of time. Thereafter, rinsing may be performed with the supplied liquid instead of ultrapure water. At this time, the rotational torque of the drive part 170 generated by a friction between the cleaning member 10 and the cleaning plate 31 may be monitored, and when the torque becomes a certain value or more, it may be determined that the surface of the cleaning member 10 is structured by water and the abrasive grains are easily adsorbed.

When the rotational torque of the drive part 170 becomes equal to or larger than a certain value as described above, the cleaning of the cleaning member 10 is completed. On the other hand, when the rotational torque does not become equal to or larger than a certain value for a predetermined time even if the cleaning member 10 has been cleaned, the apparatus control part 50 may determine that the surface of the cleaning member 10 is damaged and an abrasive grain adhesion force is lost. In this case, the apparatus control part 50 may prompt replacement of the cleaning member 10 by a notification part 80. The notification part 80 may notify replacement of the cleaning member 10 by blinking or lighting of a warning lamp, display of information prompting replacement on a display screen of a personal computer, a tablet, or the like, sound, or the like.

In the present embodiment, an aspect in which each component is controlled by the apparatus control part 50 will be mainly described, but the present invention is not limited thereto, and the function of the apparatus control part 50 may be executed by the overall control part 350 described above.

Before the notification is performed by the notification part 80 as described above, the apparatus control part 50 may control the member cleaning part 30 to re-clean the cleaning member 10 when the adhesion force of the cleaning member 10 measured by the measurement part 20 is equal to or less than the first threshold.

The measurement part 20 may measure the adhesion force of the cleaning member 10 after completion of the re-cleaning. In this case, the apparatus control part 50 may control the notification part 80 to prompt replacement of the cleaning member 10 when the measurement result of the measurement part 20 after the re-cleaning is equal to or less than the first threshold again.

It has been confirmed by the inventors of the present application that the adhesion force remains high in a case where the detergency of the cleaning member 10 is sufficient, but the adhesion force tends to decrease as the detergency decreases due to the use of the cleaning member 10. Hereinafter, as an example, results of measuring an adhesion force acting between the pencil cleaning member 150 formed of SiO2 and PVA provided at a distal end of a cantilever (probe) 21a of the AFM 21 in various chemical liquids will be described.

Figure 11:
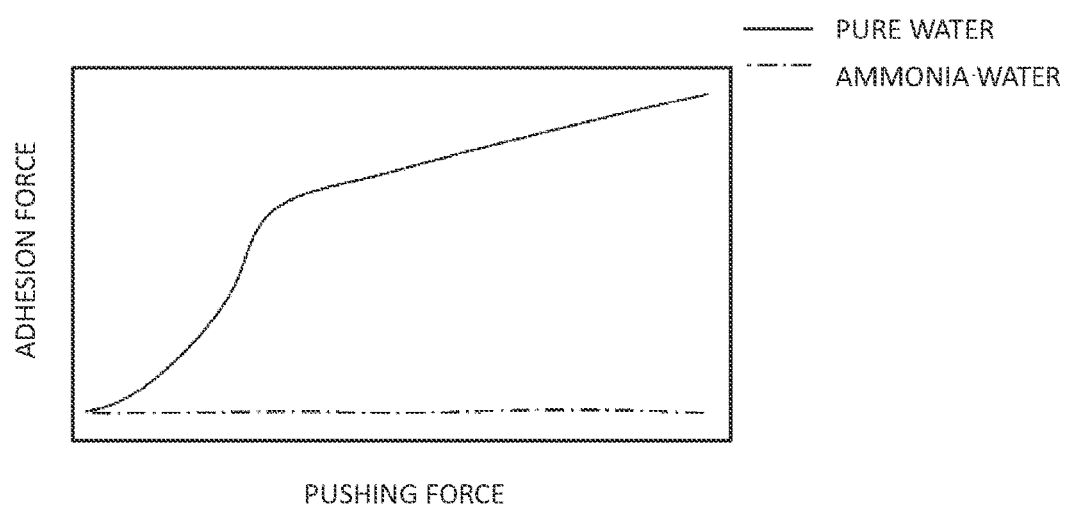
FIG. 11 is a graph showing a relationship between a pushing force of an AFM probe and a brush-probe adhesion force in pure water and ammonia water, for a polyvinyl alcohol (PVA) brush.

It has been confirmed that the adhesion force increases when a pressing force against the pencil cleaning member 150 in pure water is increased, but when the pressing force against the pencil cleaning member 150 in ammonia water is increased, the increase in adhesion force is smaller than that in pure water (see FIG. 11).

Figure 12:
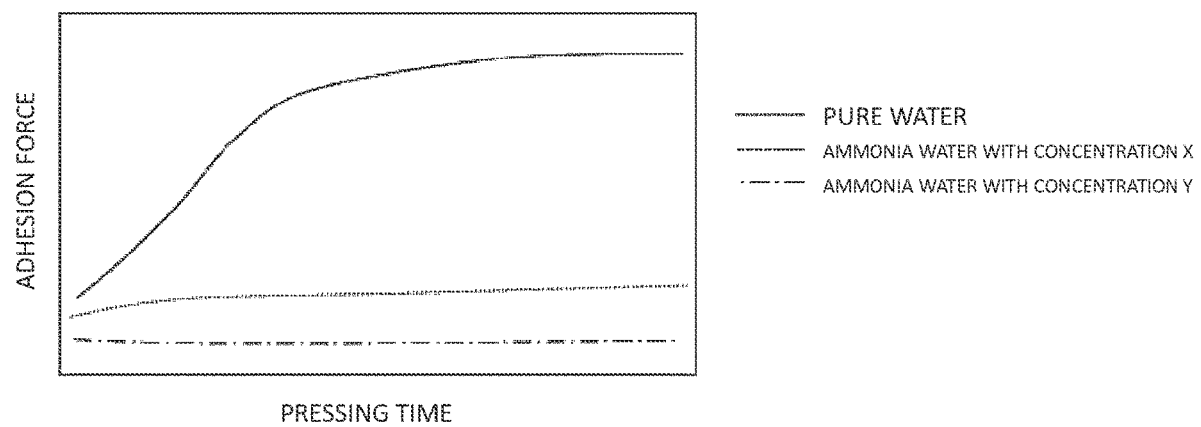
FIG. 12 is a graph showing a relationship between a time (pressing time) for which the AFM probe is maintained in a pressed state and the brush-probe adhesion force in pure water and ammonia water having different concentrations, for a PVA brush.

In addition, it has been confirmed that the adhesion force increases when a time for maintaining the probe 21a of the AFM 21 pressed against the pencil cleaning member 150 in pure water increases, but the adhesion force does not increase so much when a time for maintaining the probe 21a of the AFM 21 pressed against the pencil cleaning member 150 in ammonia water increases (see FIG. 12).

It is presumed that the reason why such behavior is exhibited is that when a chemical agent forming a hydrogen bond such as ammonia is used, hydrogen bonds between water molecules in the vicinity of a PVA surface are disturbed, mobility of PVA surface molecules is increased, abrasive grains, substrate contaminants, and the like are not adsorbed, and for example, SiO2 and the like are not adsorbed. That is, it can be presumed that removal of contaminants adhering to the surface can be promoted by increasing the mobility of the surface of the cleaning member 10.

Figure 13:
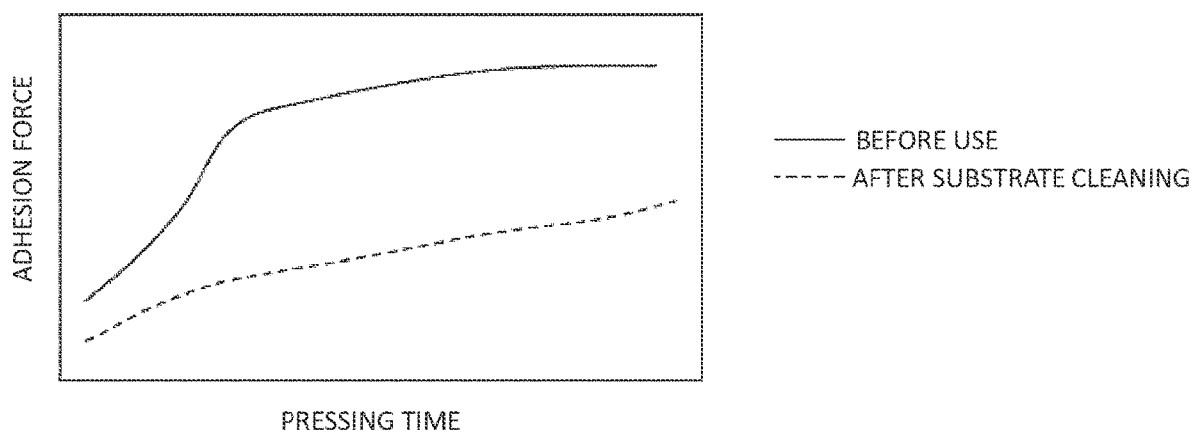
FIG. 13 is a graph showing a relationship between a time (pressing time) for which the AFM probe is maintained in a pressed state and the brush-probe adhesion force in pure water, for a new PVA brush and a PVA brush that has cleaned about 1000 substrates.

As shown in FIG. 13, it has been confirmed that in pure water, the pencil cleaning member 150 after substrate cleaning has a clearly reduced adhesion force for SiO2. In FIG. 13, a solid line indicates a result of using the new pencil cleaning member 150 before use, and a dotted line indicates a result of using the pencil cleaning member 150 having a deteriorated cleaning ability after substrate cleaning.

Therefore, the adhesion force of the new cleaning member 10 may be measured, and a threshold for determining whether or not cleaning has been performed may be set based on the measurement result. At this time, a value obtained by adding a predetermined value to the adhesion force of the new cleaning member 10 may be used as the threshold. When the adhesion force exceeds such a threshold, replacement of the cleaning member 10 is unnecessary, but when the adhesion force is equal to or less than the threshold, it may be determined that replacement of the cleaning member 10 is necessary.

According to the results described above, since a difference hardly occurs in ammonia water, the first member 210 such as a test plate may be placed in pure water instead of ammonia water while cleaning the cleaning member 10 with ammonia water, and the adhesion force of the pencil cleaning member 150 or the roll cleaning member 100 may be measured in pure water. When the lifetime, the replacement time, and the like are evaluated using the AFM 21, the pressing force may be 1.5 nN or more, and a contact time may be two seconds or more, preferably five seconds or more in pure water.

In the measurement of the adhesion force, the longer the time for pushing the cleaning member 10 is, the more the adhesion force is increased as the cleaning member conforms to a counterpart member of the test plate or the like. For this reason, the longer the pushing time, the more easily the influence of surface deterioration is exerted. Therefore, the adhesion force may be measured by pushing the cleaning member 10 to a counterpart member of the first member 210 or the like for preferably 10 seconds or more, more preferably one minute or more.

When a mechanism for measuring the adhesion force is incorporated in the substrate cleaning apparatus, it is sufficient if the first member 210 to which the cleaning member 10 is to be pressed is a smooth plate. In a case where the cleaning member 10 is formed of PVA, it is preferable to use the first member 210 formed of PMMA from the viewpoint of easily exerting the adhesion force, and it is preferable to use the first member 210 formed of quartz from the viewpoint of doubling as the cleaning plate 31 (from the viewpoint of economic efficiency). In this case, the cleaning plate and the first member may be formed as the same member, and the adhesion force at the time of separating from the cleaning plate may be measured while cleaning is performed with the cleaning plate.

The apparatus control part 50 and the overall control part 350 may be able to communicate with and control the components included in the measurement part 20 and the member cleaning part 30 (see FIG. 10). The apparatus control part 50 and the overall control part 350 have an artificial intelligence function, and may perform machine learning for a replacement timing of the cleaning member 10, determination as to whether or not cleaning of the cleaning member 10 using an adhesion force has been performed, and the like. More specifically, the type of the cleaning member 10, the material and kind of the cleaning member 10, the number of substrates W cleaned by the cleaning member 10, the adhesion force measured by the measurement part 20, and a past record regarding whether or not replacement was actually necessary may be learned by machine learning as learning data, and the apparatus control part 50 may determine whether or not replacement with a new cleaning member 10 is necessary from the type of the target cleaning member 10, the material and kind of the cleaning member 10, the number of substrates W cleaned by the cleaning member 10, the adhesion force measured by the measurement part 20, and the like based on the learning result.

<<Method>>

Figure 14:
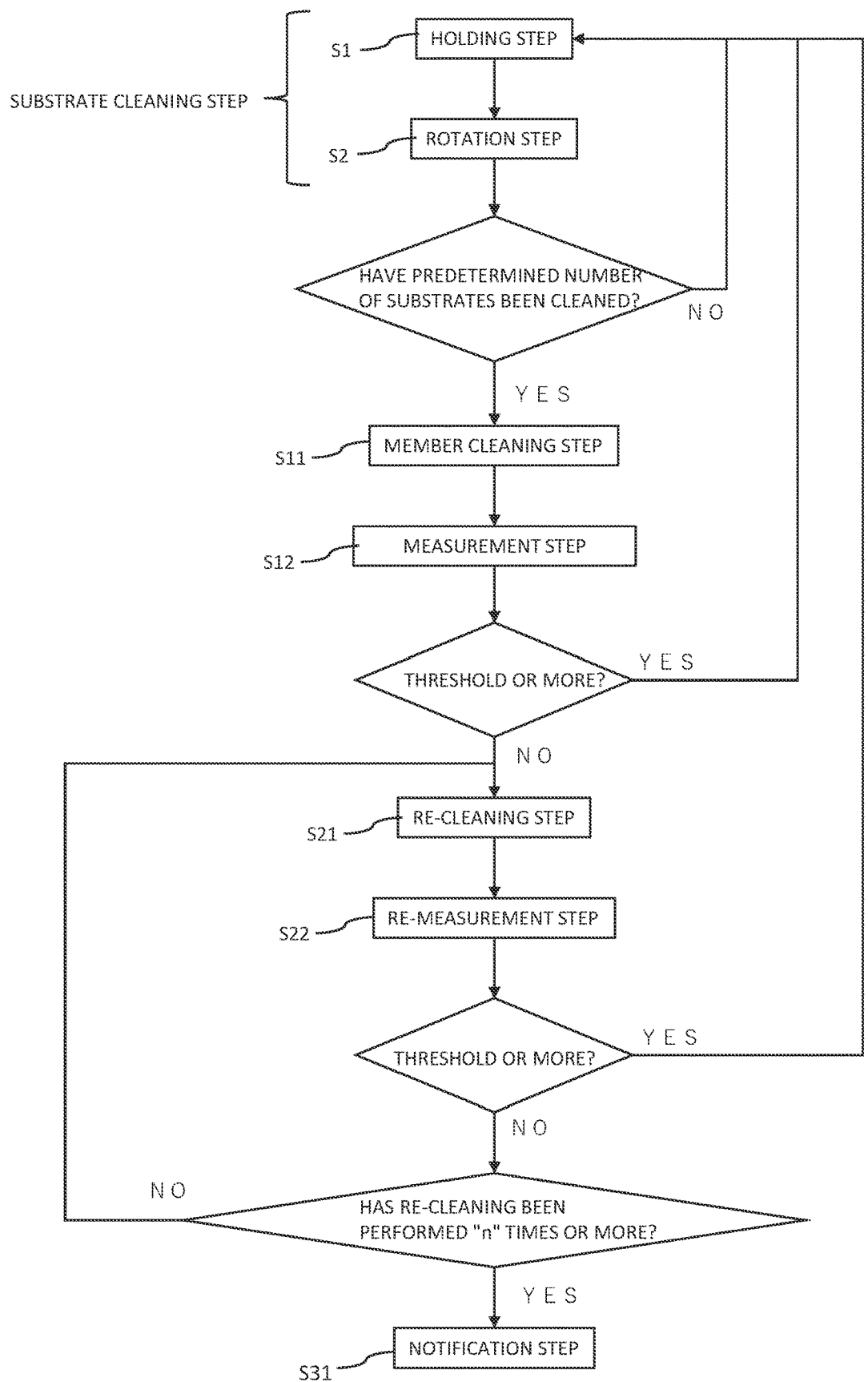
FIG. 14 is a view showing an example of a flow from substrate cleaning to cleaning member cleaning in the embodiment of the present invention.

An example of a cleanliness evaluation method for a cleaning member using a cleanliness evaluation apparatus according to the present embodiment will be described mainly with reference to FIG. 14. Note that all the aspects described in the above "Configuration" can be applied in the "Method", although it will be briefly described because the description overlap with the above. In addition, conversely, all the aspects described in the "Method" can be applied in the "Configuration". In addition, a program for performing the method according to the present embodiment may be recorded in a recording medium, and the method according to the present embodiment may be performed by the substrate processing apparatus including the cleanliness evaluation apparatus for a cleaning member by reading the recording medium with a computer (not illustrated). A series of control of the following steps is performed by each member receiving a command from the apparatus control part 50 or the overall control part 350.

The substrate W is cleaned using the cleaning member 10 (substrate cleaning step). At this time, in the substrate cleaning step, the substrate W is held by the rotation holding part 510 or the holding part 516 (holding step S1). Then, the substrate W held by the rotation holding part 510 or the holding part 516 is rotated by the rotation holding part 510 or the rotation part 517 (rotation step S2). The cleaning liquid or rinse liquid is supplied to the substrate W rotating in this manner, and during this time, the substrate W is scrubbed by the cleaning member 10.

After cleaning one or a predetermined number of substrates W, the cleaning member 10 is cleaned by the member cleaning part 30 (member cleaning step S11). The number of substrates W to be cleaned is predetermined and may be stored in the storage part 60. Furthermore, the number of substrates W may be appropriately input by an operator using an operation part 90. When the predetermined number of substrates W have been cleaned, the processing proceeds to the member cleaning step S11, but when fewer than the predetermined number of substrates W have been cleaned, the substrate cleaning step is repeatedly performed.

The member cleaning step S11 is performed by the member cleaning part 30 such as the cleaning plate 31, the external supply part 32, and the internal supply part 33. At the end of the member cleaning step S11, rinsing with ultrapure water may be performed in such a way as not to cause contamination of chemical liquid for brush cleaning and chemical liquid for substrate cleaning.

After cleaning is performed by the member cleaning part 30, the adhesion force of the cleaning member 10 is measured by the measurement part 20 such as the AFM 21 and the adhesion force measurement part 25 (measurement step S12). In a case where the adhesion force of the cleaning member 10 measured by the measurement part 20 is equal to or less than the first threshold, the member cleaning part 30 re-cleans the cleaning member 10 (re-cleaning step S21). On the other hand, in a case where the adhesion force of the cleaning member 10 measured by the measurement part 20 exceeds the first threshold, it is determined that the cleaning of the cleaning member 10 has been performed, and the cleaning of the substrate W is restarted by the cleaning member 10.

The measurement part 20 measures the adhesion force of the cleaning member 10 after completion of the re-cleaning (re-measurement step S22). In a case where the measurement result of the measurement part 20 after the re-cleaning is equal to or less than the first threshold again, the notification part 80 prompts replacement of the cleaning member 10 (notification step S31). On the other hand, in a case where the adhesion force of the cleaning member 10 measured by the measurement part 20 exceeds the first threshold, it is determined that the cleaning of the cleaning member 10 has been performed, and the cleaning of the substrate W is restarted by the cleaning member 10.

The above description has been given using the aspect in which the notification step is performed in a case where the measurement result is equal to or less than the first threshold again in the re-measurement step, but the present invention is not limited thereto, and the re-cleaning step may be performed when the measurement result is equal to or less than the first threshold again in the re-measurement step. The re-measurement step and the re-cleaning step may be performed n times ("n" is an integer). The number of times "n" may be determined in advance as a recipe and stored in the storage part 60, or may be input from the operation part 90 by the user.

In the above description, an aspect in which the degree of cleanliness of the cleaning member 10 is measured using the adhesion force of the cleaning member 10 has been described, but the present invention is not limited thereto, and even in a case where the rotational torque of the drive part 170 is used, a similar aspect (the aspect shown in FIG. 14) can be adopted.

The apparatus control part 50, the recording part, and the like according to the present embodiment may be implemented by one unit (control unit) or may be implemented by different units. The functions of a plurality of "units" may be integrated and implemented by one unit (control unit). Furthermore, the apparatus control part 50, the recording part, and the like may be implemented by a circuit configuration.

<<Effects>>

Next, effects according to the present embodiment having the above-described configuration, which have not yet been described, will be mainly described. Even if it is not described in "Configuration", any configuration described in "Effects" can be adopted in the present invention.

In a case of adopting an aspect in which the member cleaning part 30 that cleans the cleaning member 10 including the roll cleaning member 100, the pencil cleaning member 150, and the like for cleaning the substrate W is provided, and the measurement part 20 that measures the degree of cleanliness of the cleaning member 10 cleaned by the member cleaning part 30 is provided, it is possible to determine whether or not the cleaning member 10 has been cleaned by the member cleaning part 30.

It is also conceivable to operate the apparatus under the assumption that the cleaning member 10 has been cleaned without confirming whether or not the cleaning member has been cleaned as in the related art. As for the replacement time of the cleaning member 10, it is also conceivable that the cleaning member 10 is replaced when a certain number of substrates W have been cleaned, a certain period of time has elapsed, or the like, according to an empirical rule, an internal rule, or the like (Note that in a case where the cleaning member 10 is subjected to contact cleaning, the surface of the cleaning member 10 may be gradually deteriorated by wear, and the cleaning performance may be gradually deteriorated). In a case where no management is performed as described above, there may be a problem that the cleaning member 10 is continuously used even though deterioration caused by wear occurs. In addition, in a case where an aspect of replacing the cleaning member 10 beforehand is adopted, since the cleaning member 10 that can be still used is replaced, there may be a problem that the cost increases due to replacement of the cleaning member performed beforehand.

On the other hand, in a case where the aspect according to the present embodiment is adopted, it is possible to confirm whether or not the cleaning member 10 has been cleaned, and eventually, it is possible to reduce member costs by confirming whether or not cleaning of the cleaning member 10 has been implemented, and accurately grasping the replacement time of the cleaning member 10. In the future, miniaturization of a wiring in the substrate W such as a wafer will be more and more advanced, and the demand for the cleanliness of the substrate W after cleaning tends to increase. Therefore, in terms of being able to manage the cleanliness and the deterioration state of the cleaning member 10 such as a brush used for cleaning based on scientific grounds, it is more beneficial to adopt this aspect in the future. Depending on the measurement result of the measurement part 20, the operator may determine whether or not the cleaning member 10 has been cleaned by cleaning, or the apparatus control part 50 may automatically determine whether or not the cleaning member has been cleaned.

In a case where the measurement part 20 measures the adhesion force of the cleaning member 10 by using the AFM method (see FIGS. 6 to 7B), the adhesion force of the cleaning member 10 can be measured with high accuracy, and it can be determined whether or not cleaning has been performed more reliably.

From the viewpoint of accelerating the peeling of contaminants transferred from the substrate W to the surface of the cleaning member 10 by disturbing hydrogen bonds of water molecules on the surface of the cleaning member 10 and enhancing the mobility of molecular chains such as PVA on the surface of the cleaning member 10, it is advantageous to use a substance that forms a hydrogen bond with water such as ammonia/amine as cleaning chemical liquid for the cleaning member 10. At this time, the concentration of ammonia or amine is advantageously at least 0.1 wt %, and preferably 0.5 wt % or more. The upper limit value of the concentration of ammonia or amine may be 0.8 wt %, and even at such a low concentration, the effect of the cleaning member 10 as the cleaning chemical liquid can be expected. Therefore, it is possible to effectively clean the cleaning member 10 without using a high concentration of ammonia or amine, which is excellent in terms of running cost.

Further, the concentration of ammonia or amine required for cleaning the cleaning member 10 can also be checked by checking whether or not cleaning of the cleaning member 10 has been achieved by using the AFM method or by measuring the peeling force while changing the concentration of ammonia or amine as in the present embodiment. Therefore, the minimum concentration of ammonia or amine that is beneficial for cleaning can be determined, which may reduce the running cost.

In addition, it is advantageous to spray ultrapure water, alkali-based chemical liquid, or the like from the outside of the cleaning member 10 onto the cleaning member 10 or the first member 210 such as a quartz cleaning plate, or to supply ultrapure water under pressure, alkali-based chemical liquid, or the like from the cleaning liquid supply port provided inside the cleaning member 10 toward the outside of the cleaning member 10 (see FIGS. 4 and 5). In this case, as a result, the cleaning member 10 repeats suction and extrusion of the ultrapure water, the alkali-based chemical liquid, or the like, so that contaminants held by the cleaning member 10 can be discharged to the outside of the cleaning member 10. In addition, from the viewpoint of preventing contamination of the chemical liquid for brush cleaning and the chemical liquid for substrate cleaning, it is advantageous to measure a contaminant adhesion force of the brush after cleaning processing of rinsing with ultrapure water.

Since it is sufficient that contamination on the surface of the cleaning member 10 can be cleaned and removed, an aspect may be adopted in which bubbles (microbubbles) are contained in chemical liquid to be supplied, and a chemical liquid component acts on a very surface of the cleaning member 10. In this case, the chemical liquid can be saved, and the cost can be reduced. In this case, a bubble generation part 36 is provided (see FIGS. 4 and 5).

When the chemical liquid for cleaning the cleaning member 10 and the chemical liquid for cleaning the substrate W extremely interfere with each other, for example, like a combination of an acid and an alkali, it is advantageous to supply ultrapure water from the inside to the outside of the cleaning member 10 under pressure so that the chemical liquid for cleaning the cleaning member 10 does not remain in the cleaning member 10.

When cleaning the cleaning member 10, ultrapure water or chemical liquid heated to 50° C. to 60° C. or lower may be used. By adopting such an aspect, it can be expected to enhance the cleaning effect. On the other hand, in a case where ultrapure water or a chemical liquid of an excessively high temperature is used, the cleaning member 10 may be adversely affected, and thus the upper limit of the temperature is 50° C. to 60° C. as described above. When a chemical that forms a hydrogen bond, such as ammonia, is used, it is assumed that the hydrogen bond between water molecules in the vicinity of the PVA surface is disturbed and the mobility of the PVA surface molecules is increased. Therefore, increasing the temperature of ultrapure water or a chemical liquid is advantageous in terms of increasing the mobility.

In addition, also in a case of adopting an aspect in which ultrasonic waves are supplied when cleaning the cleaning member 10, the cleaning effect can be enhanced for the same reason.

By pressing the cleaning member 10 against the first member 210 and then measuring the peeling force at the time of peeling, it is possible to determine whether or not the cleaning member 10 has been cleaned with a simple configuration when the measurement part 20 measures the degree of cleanliness of the cleaning member 10. Further, by measuring the rotational torque of the drive part 170, it is possible to determine whether or not the cleaning member 10 has been cleaned with a simple configuration even when the measurement part 20 measures the degree of cleanliness of the cleaning member 10.

In a case where the apparatus control part 50 controls the member cleaning part 30 to re-clean the cleaning member 10 when the adhesion force of the cleaning member 10 or the rotational torque of the drive part 170 measured by the measurement part 20 is equal to or less than the threshold (see FIGS. 8 and 9), the cleaning member 10 can be automatically re-cleaned when the adhesion force of the cleaning member 10 or the rotational torque of the drive part 170 is equal to or less than the threshold and is a low value. Therefore, even in a case where cleaning of the cleaning member 10 is insufficient, cleaning can be performed more reliably by performing re-cleaning.

In a case where the measurement part 20 measures the adhesion force of the cleaning member 10 or the rotational torque of the drive part 170 after completion of the re-cleaning, and the apparatus control part 50 controls the notification part 80 to prompt replacement of the cleaning member 10 when the measurement result of the measurement part 20 after the re-cleaning is equal to or less than the threshold again, the replacement of the cleaning member 10 can be prompted in a case where cleaning is not made by the re-cleaning, and the cleaning member 10 is severely deteriorated.

The number of times the re-cleaning is performed is not limited to one and may be two or more. Then, in a case where cleaning of the cleaning member 10 is not achieved even after n times ("n" is an integer of 1 or more) of re-cleaning determined in advance and stored in the storage part 60, the apparatus control part 50 may control the notification part 80 to prompt replacement of the cleaning member 10. "n" may be determined in advance depending on the type of the cleaning member 10 such as the roll cleaning member 100 or the pencil cleaning member 150, the material or kind of the cleaning member 10, and the like and may be stored in the storage part 60. In a case where such an aspect is adopted, the number of times the re-cleaning is performed can be determined for each cleaning member 10, and a timing to replace the cleaning member 10 can be more appropriately grasped. The number of times the re-cleaning is performed, the type of the cleaning member 10, the material and kind of the cleaning member 10, the number of substrates W cleaned by the cleaning member 10, the past record regarding whether or not replacement was actually necessary may be learned by machine learning as learning data, and the apparatus control part 50 may derive the number of times the re-cleaning needs to be performed by using the type of a target cleaning member 10, the material and kind of the cleaning member 10, the number of substrates W cleaned by the cleaning member 10, and the like as input data based on the learning result.

The above description of the embodiments and the disclosure of the figures are merely examples for describing the invention defined in the claims, and the invention defined in the claims is not limited by the above description of the embodiments and the disclosure of the figures. In addition, the recitation of the claims at the time of filing is only an example, and the recitation of the claims can be changed as appropriate based on the description of the description, figures, and the like.

REFERENCE SIGNS LIST 10 cleaning member
20 measurement part
30 member cleaning part
50 apparatus control part (control part)
100 roll cleaning member
150 pencil cleaning member
170 drive part
210 first member
W substrate

The invention claimed is:
1. A cleaning apparatus for cleaning member comprising:
a member cleaning part that cleans a cleaning member that cleans a substrate; and
a measurement part that measures a degree of cleanliness of the cleaning member cleaned by the member cleaning part,
wherein the measurement part measures the degree of cleanliness of the cleaning member by measuring an adhesion force of the cleaning member,
wherein the measurement part measures the adhesion force of the cleaning member by pressing the cleaning member against a first member and then measuring a peeling force when the cleaning member is peeled from the first member, or by pressing the first member against the cleaning member and then measuring a peeling force when the first member is peeled from the cleaning member, and wherein the cleaning apparatus further comprises a control part that determines that the cleaning member has been cleaned when the adhesion force measured by the measurement part is more than a threshold.

2. The cleaning apparatus for cleaning member according to claim 1,
wherein the measurement part measures the adhesion force of the cleaning member by an AFM method or a measuring method using an indenter.

3. The cleaning apparatus for cleaning member according to claim 1, wherein the control part controls the member cleaning part to perform re-cleaning of the cleaning member when the adhesion force of the cleaning member measured by the measurement part is equal to or less than the threshold.

4. The cleaning apparatus for cleaning member according to claim 3,
wherein the measurement part measures the adhesion force of the cleaning member after the re-cleaning is completed, and wherein the control part controls to prompt replacement of the cleaning member when the adhesion force measured by the measurement part is equal to or less than the threshold after completing the re-cleaning n times.

5. The cleaning apparatus for cleaning member according to claim 1,
wherein the control part has an artificial intelligence function, and the control part determines whether a replacement to a new cleaning member is required by using a type of the cleaning member and the adhesion force measured by the measurement part as input data to a machine learning result, and wherein the machine learning result is obtained by using types of cleaning members and adhesion forces measured by the measurement part and past records regarding whether or not replacement was actually necessary as learning data.

* * * * *